(12) United States Patent
Lee

(10) Patent No.: US 11,799,482 B2
(45) Date of Patent: Oct. 24, 2023

(54) INTERFACE CIRCUIT AND SEMICONDUCTOR OUTPUT CIRCUIT DEVICE

(71) Applicant: SK hynix Inc., Icheon (KR)

(72) Inventor: Seung Ho Lee, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 17/713,158

(22) Filed: Apr. 4, 2022

(65) Prior Publication Data
US 2022/0231686 A1 Jul. 21, 2022

Related U.S. Application Data

(63) Continuation-in-part of application No. 17/362,655, filed on Jun. 29, 2021, which is a continuation-in-part
(Continued)

(30) Foreign Application Priority Data

Jun. 29, 2020 (KR) .................. 10-2020-0079223
Jan. 28, 2021 (KR) .................. 10-2021-0012351

(51) Int. Cl.
*H03K 3/00* (2006.01)
*H03K 19/0185* (2006.01)
*H02H 9/04* (2006.01)

(52) U.S. Cl.
CPC ..... *H03K 19/018521* (2013.01); *H02H 9/046* (2013.01)

(58) Field of Classification Search
CPC ......... H03K 17/6872; H03K 3/356113; H03K 19/20
(Continued)

(56) References Cited

U.S. PATENT DOCUMENTS 5,736,869 A 4/1998 Wei
6,690,555 B1 2/2004 Pasqualini
(Continued)

FOREIGN PATENT DOCUMENTS

KR 1020180128600 A 12/2018

OTHER PUBLICATIONS

Office Action dated Jun. 14, 2021 issued for related U.S. Appl. No. 17/073,964.
(Continued)

*Primary Examiner* — Ryan Jager

(57) ABSTRACT

A device includes an interface circuit connected between a pad and an internal circuit. The interface circuit comprises a pull-up driver including first and second PMOS transistors and a first impedance controller. The first PMOS transistor is connected between a power terminal provided to a power voltage and a first connection node and controlled by a first control bias. The second PMOS transistor connected between the first connection node and the pad and normally turned-on, and the first impedance controller is connected to the first connection node to control an impedance thereof based on the first control bias. The interface circuit further includes a pull-down driver including first and second NMOS transistors. The first NMOS transistor is connected between the pad and a second connection node and controlled by a driving voltage, and the second NMOS transistor is connected between the second connection node and a ground voltage terminal.

14 Claims, 13 Drawing Sheets

Related U.S. Application Data of application No. 17/076,474, filed on Oct. 21, 2020, now Pat. No. 11,296,694.

(60) Provisional application No. 63/181,013, filed on Apr. 28, 2021.

(58) Field of Classification Search
USPC .......................................................... 327/109
See application file for complete search history.

(56) References Cited

U.S. PATENT DOCUMENTS

| | | |
|---|---|---|
| 7,005,913 B2 | 2/2006 | Diefenderfer |
| 7,205,819 B2 | 4/2007 | Davis |
| 8,212,590 B2 | 7/2012 | Wang et al. |
| 8,994,412 B2 | 3/2015 | Kim |
| 9,893,517 B2 | 2/2018 | Dey et al. |
| 10,027,325 B1 | 7/2018 | Graves |
| 10,305,474 B2 | 5/2019 | Lee |
| 10,348,301 B2 | 7/2019 | Lee |
| 10,511,304 B2 | 12/2019 | Pan et al. |
| 10,659,047 B2 | 5/2020 | Lee |
| 10,848,154 B2 | 11/2020 | Lee |
| 2005/0219778 A1 | 10/2005 | Shigenari |
| 2006/0072267 A1 | 4/2006 | Chatty et al. |
| 2010/0176848 A1 | 7/2010 | Du et al. |
| 2010/0271118 A1 | 10/2010 | Bhattacharya et al. |
| 2011/0025380 A1 | 2/2011 | Kim et al. |
| 2017/0221879 A1 | 8/2017 | Wang et al. |
| 2018/0316185 A1 | 11/2018 | Lai et al. |

OTHER PUBLICATIONS

Kumar et al., "Power Sequence free 400Mbps 90μW 6000μm2 1.8V-3.3V Stress Tolerant I/O Buffer in 28nm CMOS", 2013, pp. 37-40, IEEE.

Rajagopal et al., "Dynamically Biased Low Power High Performance 3.3V Output Buffer in a Single Well Bulk CMOS 1.8V Oxide 45nm Process", 13th Int'l Symposium on Quality Electronic Design, 2012, 6 pages, IEEE.

Rajagopal et al., "An Enhanced Topology for Reliability of a High Performance 3.3V I/O Buffer in a Single-well Bulk CMOS 1.8v-oxide Low voltage Process", 10th Int'l Symposium on Quality Electronic Design, 2009, 4 pages, IEEE.

Marcs NG, "3.3V Transmitter Using 1.8V Transistors in a Cascode Configuration", Theses and dissertations, Paper 2056, Jan. 1, 2013, pp. 1-41.

Office Action dated Aug. 9, 2021 for U.S. Appl. No. 17/076,474.
Office Action dated Aug. 3, 2023 for U.S. Appl. No. 17/732,337.

ation Ser. No. 17/362,655 filed on Jun. 29, 2021, which
INTERFACE CIRCUIT AND SEMICONDUCTOR OUTPUT CIRCUIT DEVICE

CROSS-REFERENCE TO RELATED APPLICATION

This application is a continuation-in-part application of U.S. patent application Ser. No. 17/076,474 filed on Oct. 21, 2020, which claims priority to Korean application no. 10-2020-0079223 filed Jun. 29, 2020, U.S. patent application Ser. No. 17/362,655 filed on Jun. 29, 2021, which claims priority to Korean application no. 10-2021-0012351 filed Jan. 28, 2021, and U.S. Provisional patent application No. 63/181,013 filed on Apr. 28, 2021, the entire disclosures of which are incorporated herein by reference.

BACKGROUND

Field of Invention

The present disclosure relates to an electronic device, and more particularly, to an output driving circuit and a semiconductor device including the same.

Description of Related Art

In a recent chip, a high-speed interface IP, which requires a low power voltage and a high-speed operation, is commonly used. Accordingly, an operation voltage of an element configuring an operation circuit in the chip is gradually lowered. For example, as an operation voltage for driving the existing chip, 1.8V was widely used, but for a high speed operation and low power consumption, an operation voltage of 1.2V is also gradually used.

That is, as an operation speed of a semiconductor memory increases, an operation voltage lower than the existing operation voltage is desirable for reducing one or more of power consumption, noise, and an input/output pad capacitance. Accordingly, an output driving circuit capable of a reliable operation even at a low operation voltage has been developed.

SUMMARY

According to example embodiments, there may be provided an interface circuit, the interface circuit is connected between a pad and an internal circuit. The interface circuit comprises a pull-up driver including a first PMOS transistor, a second PMOS transistor and a first impedance controller. The first PMOS transistor is connected between a power terminal provided to a power voltage and a first connection node and controlled by a first control bias. The second PMOS transistor connected between the first connection node and the pad and normally turned-on, and the first impedance controller is connected to the first connection node to control an impedance of the first connection node based on the first control bias. The interface circuit further includes a pull-down driver including a first NMOS transistor and a second NMOS transistor. The first NMOS transistor is connected between the pad and a second connection node and controlled by a driving voltage, and the second NMOS transistor is connected between the second connection node and a ground voltage terminal. The first PMOS transistor and the second PMOS transistor are driven by the driving voltage and a difference between the first control bias and the power voltage is substantially equal to or less than a maximum operating voltage of the first and second PMOS transistors.

According to example embodiments, there may be provided an interface circuit, the interface circuit is connected between a pad and an internal circuit. The interface circuit may include a plurality of transistors driven by a first power voltage. The interface circuit configured to receive a second power voltage greater than the first power voltage. The interface circuit may include a level shifter, an N-driver control logic, a driver bias controller, a pull-up driver and a pull-down driver. The level shifter is configured to receive the second power voltage and a first bias voltage to generate a first PMOS control signal and a plurality of second PMOS control signals. The first PMOS control signal may include a voltage level so that a voltage difference between itself and the second power voltage is below a maximum operating voltage. The N-driver control logic is configured to receive the first power voltage to generate a first NMOS control signal and a plurality of second NMOS control signals. The driver bias controller is configured to detect a voltage of the pad to generate a P bias voltage and an N bias voltage based on the detected voltage of the pad. The pull-up driver may include a first PMOS transistor and a second PMOS transistor. The first PMOS transistor is connected between a first terminal provided to the second power voltage and a first connection node and is controlled by the first PMOS control signal. The second PMOS transistor is connected between the first connection node and the pad and controlled based on the P bias voltage. The pull-down driver may include a first NMOS transistor and a second NMOS transistor. The first NMOS transistor is connected between the pad and a second connection node and is controlled by the N bias voltage. The second NMOS transistor is connected between the second connection node and a second terminal provided to a ground voltage and controlled by the first NMOS control signal.

According to example embodiments, there may be provided a semiconductor integrated circuit device. The semiconductor integrated circuit device may include an internal circuit and an interface circuit. The internal circuit may receive a first power voltage to output a data signal having a first power voltage level. The interface circuit may include a plurality of low voltage transistors driven by the first power voltage. The interface circuit may receive a second power voltage greater than the first power voltage as a power source. The interface circuit may receive at least one control bias for controlling an internal voltage of the low voltage transistors of no more than a maximum operating voltage to provide an output pad with the data signal having a level of the second power voltage. The maximum operating voltage may be about 1.1 times to about 1.2 times the first power voltage. At least one of the control voltages may be generated based on a detection result of a voltage of the output pad to compensate an output delay of the data signal having the second power voltage level.

DETAILED DESCRIPTION

Specific structural or functional descriptions of embodiments according to the concept which are disclosed in the present specification or application are illustrated only to describe embodiments according to the concept of the present disclosure. The embodiments according to the concept of the present disclosure may be carried out in various forms and the descriptions are not limited to the embodiments described in the present specification or application.

As an operation speed of an integrated circuit device including a plurality of semiconductor elements increases, a driving voltage of the integrated circuit device also decreases. For example, an interface voltage used as input/output power of the integrated circuit device is changing from 1.8V to 1.2V. When the interface voltage is decreased, power consumption, noise, and a pad capacitance of the integrated circuit device may be reduced.

For example, an interface voltage may provide to an interface circuit connected between a semiconductor memory device and a memory controller configured to control the semiconductor memory device, as power voltage. As the semiconductor memory device is driven at a low voltage, for example, 0.8V to 1.2V, the interface circuit also requires a low interface voltage. So transistors constituting the interface circuit are gradually being changed from a transistor having a thick gate oxide (hereinafter, a high voltage transistor) to a transistor having a thin gate oxide (hereinafter, a high voltage transistor). As the low voltage transistors are applied to the interface circuit, the power consumption of the integrated circuit device including the interface circuit and an area of the interface circuit may be reduced.

Generally, the interface circuit may receive both a low voltage corresponding to 0.8V and a high voltage (or medium voltage) corresponding to 1.2V~1.8V. At this time, if the interface circuit is composed of low voltage transistors driven at 0.8V, reliability of the low voltage transistors constituting the interface circuit must be maintained even when the high voltage (1.2V to 1.8V) greater than its driving voltage is received.

Figure 1:
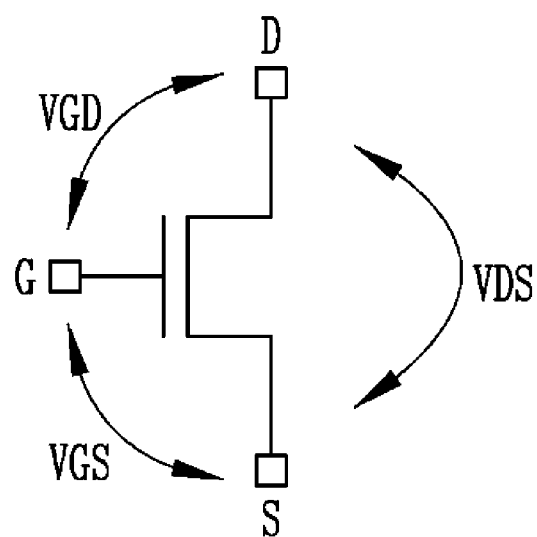
FIG. 1 is a view illustrating an operation condition of a low voltage transistor in accordance with example embodiments.

FIG. 1 is a view illustrating an operation condition of a low voltage transistor in accordance with example embodiments.

In order for the low voltage transistor 100 to stably operate, internal voltages of the low voltage transistor 100, for example, a gate-source voltage VGS, a gate-drain voltage VGD, and a drain-source voltage VDS are required to satisfy reliability condition. For example, a range for guaranteeing reliabilities of a gate-source voltage VGS, a gate-drain voltage VGD and a drain-source voltage VDS of the low voltage transistor may be about 1.1 times to about 1.2 times of the driving voltage of the low voltage transistor 100.

For example, when the driving voltage of the low voltage transistor 100 may be set about 0.8V, the gate-source voltage VGS, the gate-drain voltage VGD and the drain-source voltage VDS (hereinafter, internal voltages) of the low voltage transistor 100 may be within about 0.88V to about 0.96V to guarantee the reliability of the low voltage transistor 100.

Hereinafter, a voltage of about 1.1 to 1.2 times the driving voltage may be referred to as maximum operating voltage.

Figure 2:
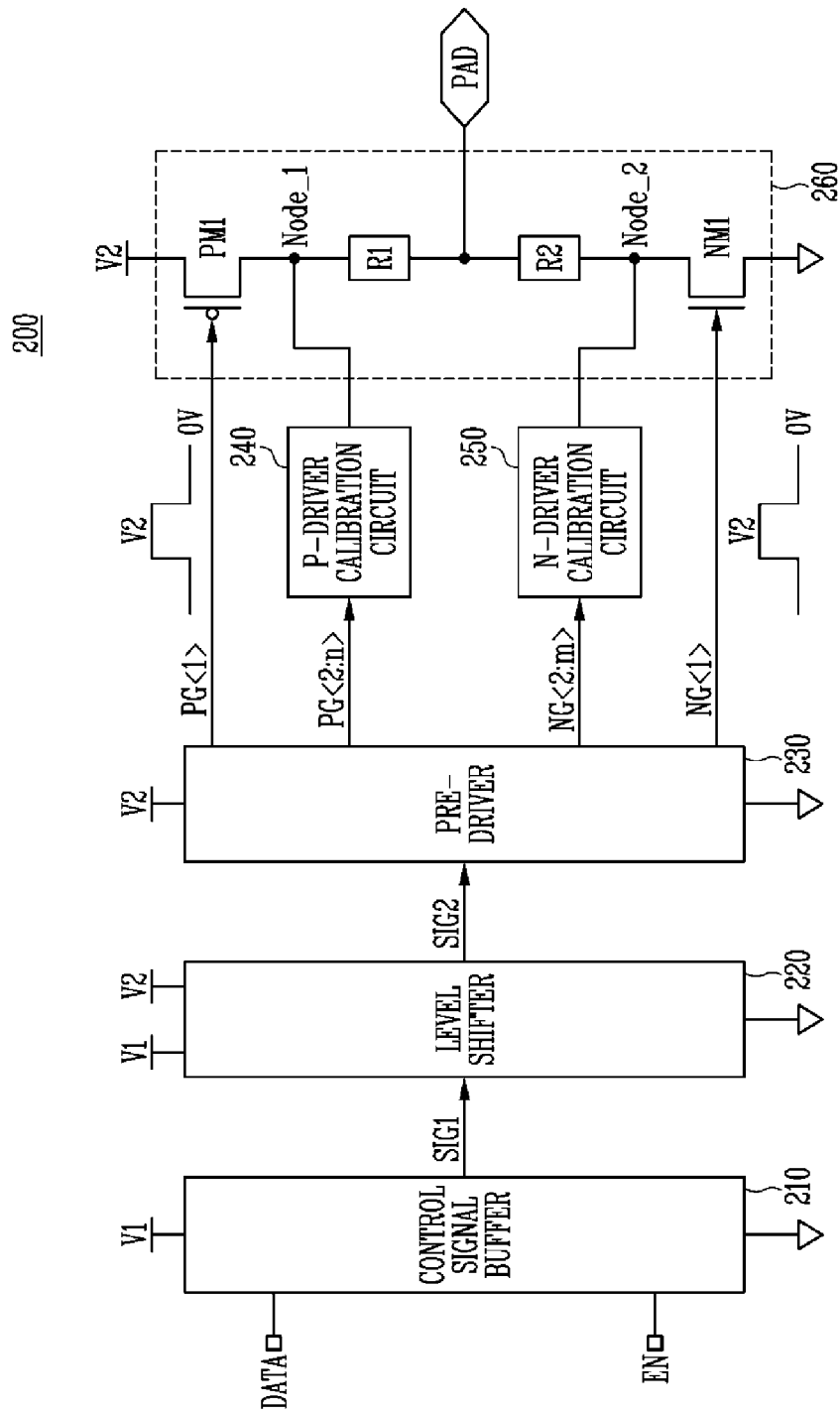
FIG. 2 is a circuit diagram illustrating an output driving circuit according to an embodiment of the present disclosure.

FIG. 2 is a circuit diagram illustrating an output driving circuit 200 according to an embodiment of the present disclosure.

Referring to FIG. 2, the output driving circuit 200 includes a control signal buffer 210, a level shifter 220, a pre-driver 230, a first driver calibration circuit (e.g., a P-driver calibration circuit) 240, a second driver calibration circuit (e.g., an N-driver calibration circuit 250), and a driver (e.g., a pull-up-pull-down driver) 260. The pull-up-pull-down driver 260 includes a PMOS transistor PM1, an NMOS transistor NM1, a first resistor R1, and a second resistor R2. The control signal buffer 210 receives a data signal DATA and an enable signal EN, and outputs a first signal SIG1. The control signal buffer 210 may be operated by a first power voltage V1. Therefore, the first signal SIG1 may be a signal having a voltage range between 0V and the first power voltage V1. In an embodiment, the first power voltage V1 may be a voltage having any value in a range of 0.8V to 1V.

The level shifter 220 receives the first signal SIG1 and level-shifts the first signal SIG1 to generate a second signal SIG2. The level shifter 220 may be operated by the first power voltage V1 and a second power voltage V2. The second power voltage V2 may be an external voltage having a voltage level greater than that of the first power voltage V1. The first power voltage V1 may be an internal voltage. Therefore, the second signal SIG2 may be a signal having a voltage range between 0V and the second power voltage V2. In an embodiment, the second power voltage V2 may be a voltage having any value in a range of 1.2V to 1.8V. That is, in example embodiments, the first power voltage V1 may be a low voltage and the second power voltage may be a high voltage V2 higher than the first power voltage.

The pre-driver 230 outputs a plurality of PMOS gate signals PG<1:n> and a plurality of NMOS gate signals NG<1:m> based on the second signal SIG2. A first PMOS gate signal PG<1> among the PMOS gate signals PG<1:n> is applied to the PMOS transistor PM1. Second to n-th PMOS gate signals PG<2:n> among the PMOS gate signals PG<1:n> are applied to the P-driver calibration circuit 240. A first NMOS gate signal NG<1> among the NMOS gate signals NG<1:n> is applied to the NMOS transistor NM1. Second to n-th NMOS gate signals NG<2:n> among the NMOS gate signals NG<1:n> are applied to the N-driver calibration circuit 250. That is, the pre-driver 230 may output the PMOS gate signals PG<1:n> and the NMOS gate signals NG<1:m> of a code form.

The P-driver calibration circuit 240 may be a circuit for calibrating an impedance of a first node NODE_1. An embodiment of the P-driver calibration circuit 240 is described later with reference to FIG. 3A. Meanwhile, the N-driver calibration circuit 250 may be a circuit for calibrating an impedance of a second node NODE_2. An embodiment of the N-driver calibration circuit 250 is described later with reference to FIG. 3B.

Meanwhile, the pre-driver 230 may operate by the second power voltage V2. Therefore, the PMOS gate signals PG<1:n> and the NMOS gate signals NG<1:m> may be signals each having a voltage range between 0V and the second power voltage V2. In particular, as shown in FIG. 2, the first PMOS gate signal PG<1> applied to the PMOS transistor PM1 and the first NMOS gate signal NG<1> applied to the NMOS transistor NM1 may be signals having a voltage range between 0V and the second power voltage V2 (for example, 1.8V).

Thus, the internal voltages of the PMOS transistor PM1 and the NMOS transistor NM1, gate-source voltages VGS, gate-drain voltages VGD and drain-source voltages VDS of the PMOS transistor PM1 and the NMOS transistor NM1 in FIG. 2 may be above the maximum operating voltage of the low voltage transistor so that reliability of the PMOS transistor PM1 and the NMOS transistor NM1 may not be guaranteed.

Figure 3A:
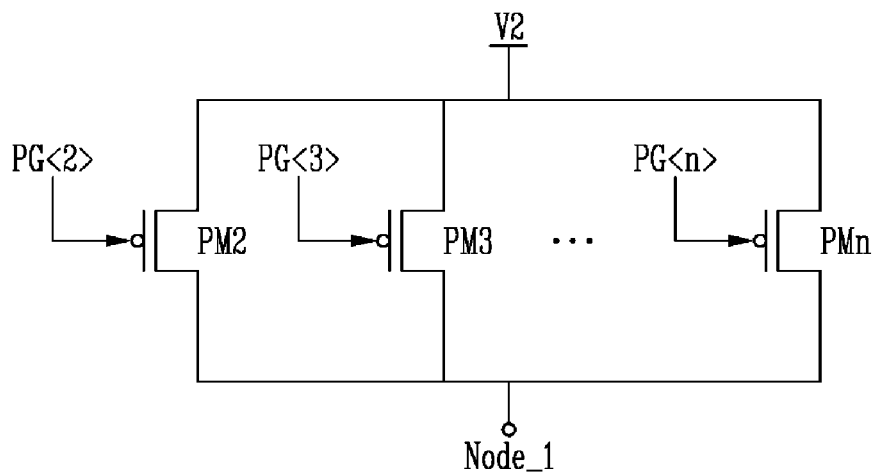
FIG. 3A is a circuit diagram illustrating a P-driver calibration circuit according to an embodiment of the present disclosure.

FIG. 3A is a circuit diagram illustrating a P-driver calibration circuit 240a suitable for use as the P-driver calibration circuit 240 of FIG. 2, according to an embodiment of the present disclosure. Referring to FIG. 3A, the P-driver calibration circuit includes second to n-th PMOS transistors PM2 to PMn. The second to n-th PMOS transistors PM2 to PMn may be connected in parallel between the second power voltage V2 and the first node NODE_1. Meanwhile, the second to n-th PMOS gate signals PG<2:n> may be applied to gate terminals of the second to n-th PMOS transistors PM2 to PMn. Accordingly, the impedance of the first node NODE_1 may be calibrated by the second to n-th PMOS gate signals PG<2:n> output in the code form.

Figure 3B:
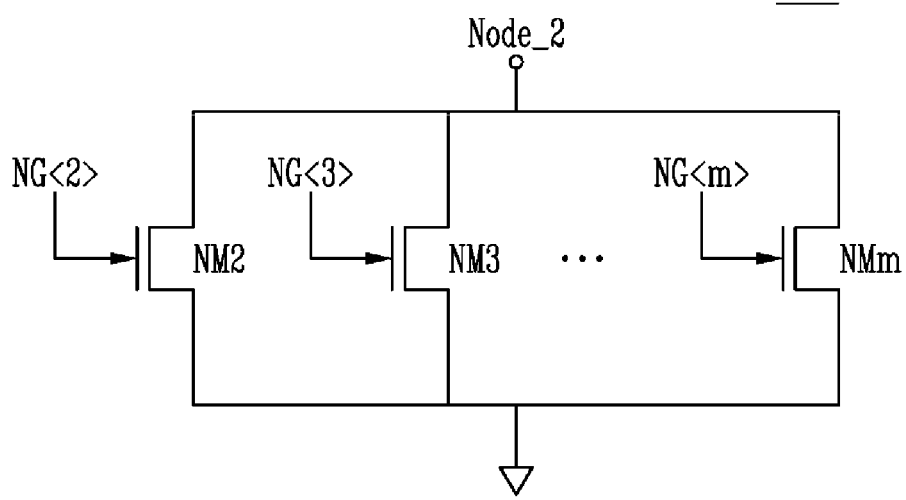
FIG. 3B is a circuit diagram illustrating an N-driver calibration circuit according to an embodiment of the present disclosure.

FIG. 3B is a circuit diagram illustrating an N-driver calibration circuit 250a suitable for use as the N-driver calibration circuit 250 of FIG. 2, according to an embodiment of the present disclosure.

Referring to FIG. 3B, the N-driver calibration circuit includes second to m-th NMOS transistors NM2 to NMm. The second to m-th NMOS transistors NM2 to NMm may be connected in parallel between the second node NODE_2 and a ground. Meanwhile, the second to m-NMOS gate signals NG<2:m> may be applied to gate terminals of the second to m-th NMOS transistors NM2 to NMm. Accordingly, the impedance of the second node NODE_2 may be calibrated by the second to m-th NMOS gate signals NG<2:m> output in the code form.

Figure 4A:
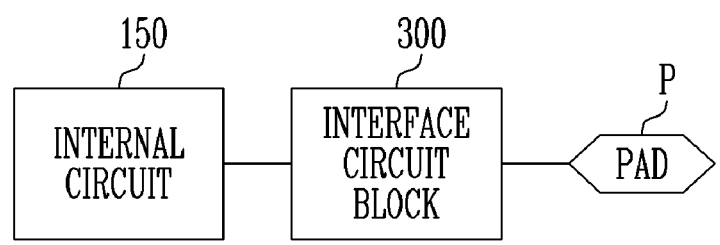
FIG. 4A is a block diagram illustrating a semiconductor output circuit device in accordance with example embodiments.
Figure 4B:
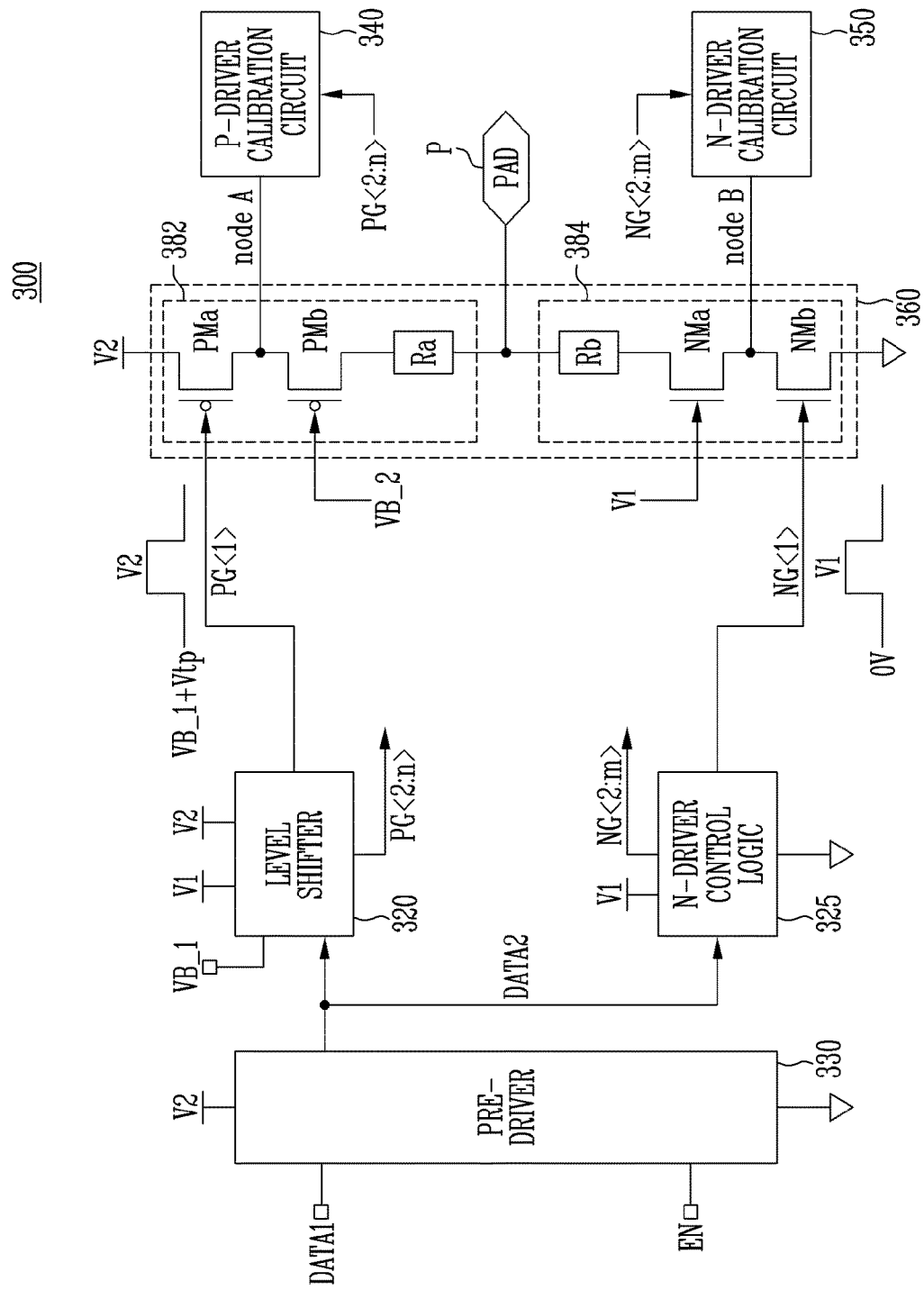
FIG. 4B is a block diagram illustrating the interface circuit block in FIG. 4A.

FIG. 4A is a block diagram illustrating a semiconductor output circuit device in accordance with example embodiments and FIG. 4B is a block diagram illustrating the interface circuit block in FIG. 4A.

Referring to FIG. 4A, a semiconductor output circuit device 10 may include an internal circuit block 150, an interface circuit block 300 and a pad P.

The internal circuit block 150 may include a memory cell array and a control circuit configured to drive the memory cell array. Alternatively, the internal circuit block 150 may include various circuits as well as the memory cell array and the control circuit. For example, the internal circuit block 150 may receive a first power voltage to output a data signal having the first power voltage level.

The interface circuit block 300 may include a circuit configured to control a characteristic difference between the internal circuit block 150 and the pad P. In example embodiments, the interface circuit block 300 may control a difference between an input/output signal of the internal circuit block 150 and an input/output signal of the pad P. The interface circuit block 300 may include a plurality of low voltage transistors driven by the first power voltage V1. The interface circuit block 300 may receive a second power voltage V2 greater than the first power voltage as a power source. The interface circuit block 300 may receive a plurality of control voltages for controlling an internal voltage of the low voltage transistors of no more than the maximum operating voltage. The interface circuit block 300 may convert a data signal having the first power voltage level into a data signal having the second power voltage level. The interface circuit block 300 may then provide the pad P with the data signal having the second power voltage level.

A another type of preferred output driving circuit is disclosed in U.S. patent application Ser. No. 17/073,964, filed Oct. 19, 2020 and entitled, "OUTPUT DRIVING CIRCUIT,", the entire disclosure of which is incorporated herein by reference.

Referring to FIG. 4B, the interface circuit block 300 may include a pre-driver 330, a level shifter 320, a driver control logic (e.g., an N-driver control logic) 325, a first driver calibration circuit (e.g., a P-driver calibration circuit) 340, a second driver calibration circuit (e.g., an N-driver calibration circuit) 350, and an output driver 360.

The pre-driver 330, the level shifter 320, the N-driver control logic 325, the P-driver calibration circuit 340, the N-driver calibration circuit 350 and the output driver 360 may include a plurality of low voltage transistors, respectively. For example, the low voltage transistors of the pre-driver 330, the low voltage transistors of the level shifter 320, the low voltage transistors of the N-driver control logic 325, the low voltage transistors of the P-driver calibration circuit 340, the low voltage transistors of the N-driver calibration circuit 350 and the low voltage transistors of the output driver 360 may be driven at the first power voltage V1. Even if, the interface circuit block 300 composed of the low voltage transistors receives the second power voltage V2 greater than the first power voltage V1 and the maximum operating voltage, at least one control bias may be applied to selected electrodes of specific low transistors of the interface circuit block 300, to guarantee the reliability of the low voltage transistors The pre-driver 330 may receive a first data signal DATA1 and an enable signal EN to output a second data signal DATA2. Since the pre-driver 330 may include at least one low voltage transistor, the pre-driver 330 may be driven at the first power voltage V1. Thus, the second data signal DATA2 of the pre-driver 330 may have a voltage level of about 0V to about 1V corresponding to a range of the first power voltage V1.

The second data signal DATA2 and the first data signal DATA1 may be substantially same. For example, the second data signal may be generated based on the first data signal DATA1.

In example embodiments, the first data signal DATA1 may be provided from the internal circuit 150. The pre-driver 330 may buffer the first data signal DATA1 using the first power voltage V1 to output the second data signal DATA1. For example, the second data signal DATA2 may have a logic level substantially the same as a logic level of the first data signal DATA1. In contrast, the voltage level of the second data signal DATA2 may be different from that of the first data signal DATA1.

The level shifter 320 may receive the second data signal DATA2 to output a plurality of PMOS gate signals PG<1> and PG<2:n>. The level shifter 320 may receive the first power voltage V1, the second power voltage V2, as the power source. Further, the level shifter 320 may receive a first bias voltage VB_1 to generate the control bias.

The level shifter 320 may output the first PMOS gate signal PG<1> (hereinafter, referred to as a first control bias) based on the first bias voltage VB_1. In example embodiments, a voltage range of the first control bias PG<1> may have about (VB 1+Vtp) to the second power voltage V2. The voltage 'Vtp' may be a threshold voltage of the first PMOS transistor PMa. For example, all of the PMOS transistors constituting the interface circuit block 300 may include the same threshold voltage Vtp. In embodiments, although a source of the first PMOS transistor PMa may directly receive the second power voltage V2 greater than the maximum operating voltage, internal voltages VGS, VGD and VDS of the first PMOS transistor PMa may be between 0V and the maximum operating voltage, because the first control bias PG<1> is applied to a gate of the first PMOS transistor PMa. Thus, the reliability of the first PMOS transistor directly receiving the second power voltage V2 is guaranteed.

Further, the level shifter 320 may output the second to n-th PMOS gate signals PG<2:n> based on the first bias voltage VB_1. Similarly to the first control bias PG<1>, the level shifter 320 may output the second to n-th PMOS gate signals PG<2:n> each having a voltage range of (VB_1+ Vtp) to V2. The level shifter 320 may generate the second to n-th PMOS gate signals PG<2:n> as a calibration control signal for controlling the P-driver calibration circuit 340.

An embodiment of the level shifter 320 of FIG. 4B is described later with reference to FIG. 5.

The N-driver control logic 325 may receive the second data signal DATA2 to output a plurality of NMOS gate signals NG<1> and NG<2:m>. The N-driver control logic 325 may receive the first power voltage V1 as a power source of the N-driver control logic 325. Thus, the N-driver control logic 325 may output the NMOS gate signal NG<1: m> having a voltage range between about 0V and the first power voltage V1. Thus, internal voltages VGS, VGD and VDS of the second NMOS transistor NMb receiving the NMOS gate signal NG<1> may be within the maximum operating voltage, because the second NMOS transistor may include the low voltage transistor driven at the first power voltage V1 (for example, about 0V to about 1V).

The output driver 360 may include a pull-up driver 382 and a pull-down driver 384. The pull-up driver 382 may include a first PMOS transistor PMa, a second PMOS transistor PMb, and a first resistor Ra which are serially connected.

The source of the first PMOS transistor PMa may be connected with a terminal to which the second power voltage V2 may be applied, as above. The drain of the first PMOS transistor PMa may be connected to a node A. The gate of the first PMOS transistor PMa may receive the first control bias PG<1> ((VB 1+Vtp)~V2) to secure the reliability of the first PMOS transistor PMa. The node A may be connected to the source of the second PMOS transistor PMb and the P-driver calibration circuit 340 in common.

The source of the second PMOS transistor PMb may be connected to the node A. The drain of the second PMOS transistor PMb may be connected to the first resistor Ra. The gate of the second PMOS transistor PMb may receive the second bias voltage VB_2. In example embodiments, the second PMOS transistor PMb may be maintained in a normally turn-on state. Thus, the second bias voltage VB_2 corresponding to a gate signal of the second PMOS transistor PMb should be set in a range where internal voltages VGS, VGD and VDS of the second PMOS transistor PMb do not exceed the maximum operating voltage. When the pull-down driver 384 may be driven, the second bias voltage VB_2 may control the voltage level of the node A so that a voltage difference between the voltage of the node A and the first control signal PG<1> may be within the maximum operating voltage.

The first resistor Ra may be connected between the drain of the second PMOS transistor PMb and the pad P. For example, the first resistor Ra may include an electrostatic discharge (ESD) protection resistor. When the interface circuit block 300 may output an output signal through the pad p, the first resistor Ra may finally control an impedance of the output signal.

The second resistor Rb of the pull-down driver 384, the first NMOS transistor NMa and the second NMOS transistor NMb may be connected between the pad P and the ground terminal in serial.

The second resistor Rb may be connected between the pad P and the drain of the first NMOS transistor NMa. The second resistor Rb may include an ESD protection circuit as the first resistor Ra. The second resistor Rb may finally control the impedance of the output signal.

The drain of the first NMOS transistor NMa may be connected to the second resistor Rb. The source of the first NMOS transistor NMa may be connected to the node B. The gate of the first NMOS transistor NMa may receive the first power voltage V1. The node B may be connected to the drain of the second NMOS transistor MNb and the N-driver calibration circuit 340.

A preferred low voltage and high voltage tolerant ESD circuit is disclosed in U.S. patent application Ser. No. 17/362,655, filed Jun. 29, 2021 and entitled, "ELECTROSTATIC DISCHARGE CIRCUIT AND ELECTROSTATIC DISCHARGE CONTROL SYSTEM,", the entire disclosure of which is incorporated herein by reference.

The drain of the second NMOS transistor NMb may be connected to the node B. The source of the second NMOS transistor NMb may be connected to the ground terminal. The gate of the second NMOS transistor NMb may receive the first NMOS gate signal NG<1> corresponding to the first power voltage V1. For example, the first power voltage may swing between 0V and V1.

In example embodiments, the first bias voltage VB_1 and the second bias voltage VB_2 may be provided to the interface circuit block 300 separately from the first and second power voltages V1 and V2, to stabilize the low voltage transistors constituting the interface circuit block 300. Alternatively, the first bias voltage VB_1 and the second bias voltage VB_2 may be generated in the interface circuit block 300. In this case, the interface circuit block 300 may include a regulating circuit for generating the first bias voltage VB_1 and the second bias voltage VB_2 based on the first voltage V1 or the second voltage V2.

The P-driver calibration circuit 340 is connected to a node NODE_A of the output driver 360. The N-driver calibration circuit 350 is connected to a node NODE_B of the output driver 360.

In FIG. 4B, the P-driver calibration circuit 340 and the N-driver calibration circuit 350 may be substantially the same as the P-driver calibration circuit 240a and the N-driver calibration circuit 250a shown in FIGS. 3A and 3B, respectively. Therefore, repetitive description of the P-driver calibration circuit 340 and the N-driver calibration circuit 350 is omitted. In example embodiments, the P-driver calibration circuit 240 may be connected to the node A to primarily control the impedance between the interface circuit block 300 and the pad P. Similarly, the N-driver calibration circuit 350 may be connected to the node B to primarily control the impedance between the interface circuit block 300 and the pad P.

In example embodiments, the interface circuit block 300 may receive the first power voltage V1 and the second power voltage V2. Alternatively, the interface circuit block 300 may include the low voltage transistors driven by the first power voltage V1

Figure 5:
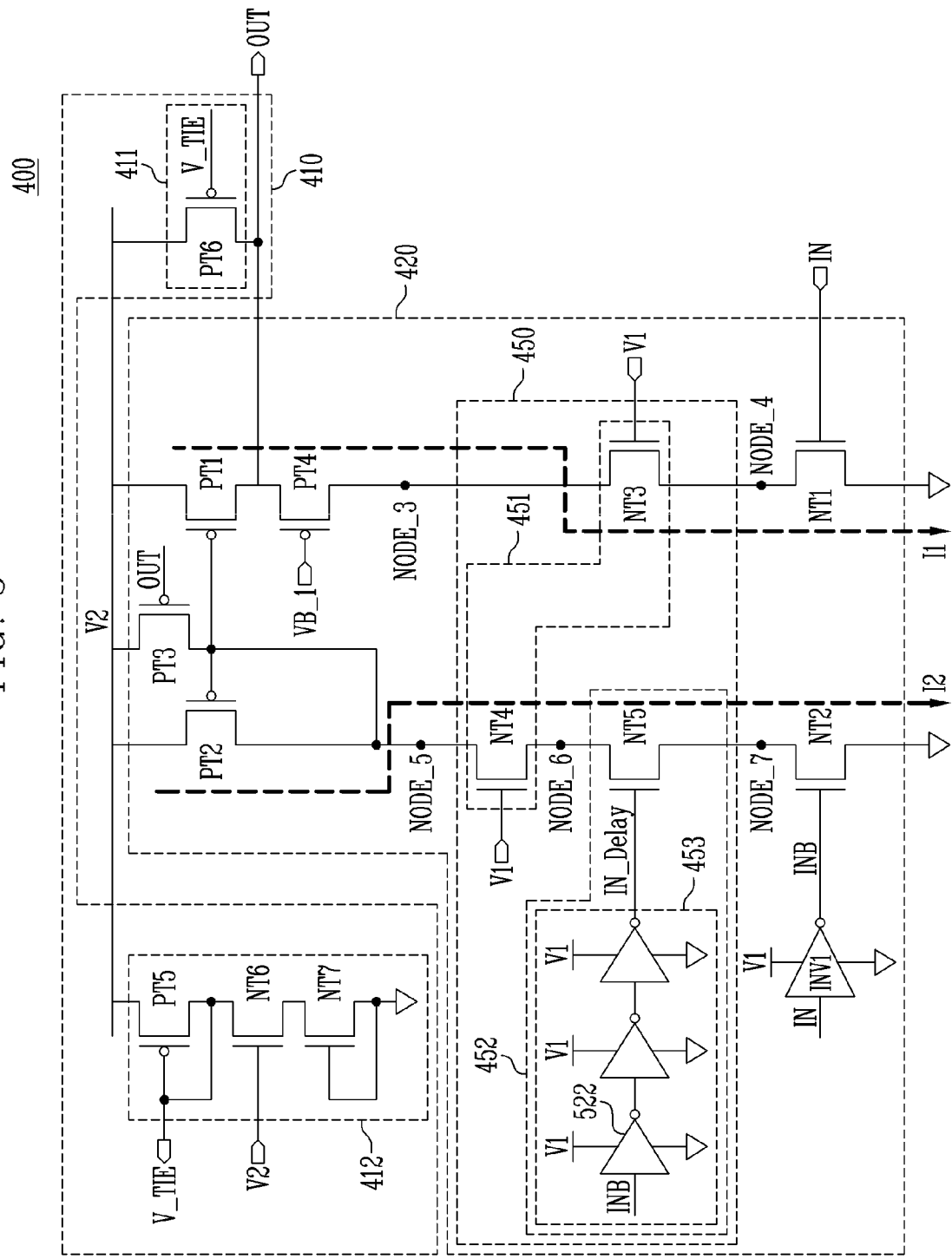
FIG. 5 is a diagram illustrating a configuration of a level shifter shown in FIG. 4 according to an embodiment of the present disclosure.

FIG. 5 is a diagram illustrating a configuration of a level shifter 400 suitable for use as the level shifter 320 shown in FIG. 4B.

Referring to FIG. 5, the level shifter 400 may include a current mirror 420, a first adjustment circuit 430, and a second adjustment circuit 410.

The level shifter 400 according to an embodiment of the present disclosure may further include a third adjustment circuit 450.

The current mirror 420, the first adjustment circuit 430, the second adjustment circuit 410 and the third adjustment circuit 450 of example embodiments may include at least one low voltage transistor driven at the first power voltage V1, respectively. Although the level shifter 400 may include the low voltage transistor, the level shifter 400 may receive the second power voltage V2 as the power source.

The current mirror 420 may receive an input signal IN according to the first power voltage V1 and mirror a current corresponding to the second power voltage V2 according to a level of the input signal IN to generate an output signal OUT. The input signal IN may be the second data signal DATA2 shown in FIG. 4. In addition, the output signal OUT may be the first PMOS gate signal PG<1> shown in FIG. 4B.

As above, the second power voltage V2 may have a level higher than that of the first power voltage V1.

The current mirror 420 may include an inverter INV1 and a plurality of switching elements NT1, NT2, PT1, PT2, and PT3. The plurality of switching elements NT1, NT2, PT1, PT2, and PT3 may be implemented as the low voltage transistors driven at the low voltage, for example, 0.8V.

A first current path I1 of the current mirror 420 may be formed by a plurality of switching elements PT1, PT4, NT3, and NT1.

A second current path I2 of the current mirror 420 may be formed by a plurality of switching elements PT2, NT4, NT5, and NT2.

The first adjustment circuit 430 may be connected to an output terminal of the current mirror 420. For example, the first adjustment circuit 430 may include a PMOS transistor. The first adjustment circuit 430 may receive the first bias voltage VB_1 as a gate signal, to adjust internal voltages of the first adjustment circuit 430. That is, the first bias voltage VB_1 should be set in a range where the internal voltages VGS, VGD and VDS of the first adjustment circuit 430 do not exceed the maximum operating voltage.

For example, the first adjustment circuit 430 may be connected to a terminal of the output voltage OUT of the current mirror 420 and may be configured to adjust a voltage level of the terminal of the output voltage OUT according to the first bias voltage VB_1.

The first adjustment circuit 430 may include a switching element, for example, the PMOS transistor PT4 in the first current path I1.

The second adjustment circuit 410 may be connected between the terminal receiving the second power voltage V2 and the output terminal of the current mirror 420. For example, the second adjustment circuit 410 may provide the output terminal of the current mirror 420 with a compensation current corresponding to a current amount of the current mirror 420.

For example, the second adjustment circuit 410 may be connected to a terminal of the second power voltage V2 in parallel with the current mirror 420 and may be configured to adjust the voltage level of the terminal of the output voltage OUT of the current mirror 420.

The second adjustment circuit 410 may include an output voltage compensator 411 and a compensation voltage generator 412.

The output voltage compensator 411 may prevent the voltage level of the terminal of the output voltage OUT from being lower than the voltage level increased by the first adjustment circuit 430 according to a compensation voltage V_TIE.

The compensation voltage generator 412 may be connected to the terminal of the second power voltage V2 in parallel with the current mirror 420 to generate the compensation voltage V_TIE.

The second adjustment circuit 410 may include a plurality of switching elements PT5, PT6, NT6, and NT7.

The third adjustment circuit 450 may be connected to the first current path and the second current path of the current mirror 420, and may be configured to adjust a voltage level of the first current path and the second current path and block a leakage current.

The third adjustment circuit 450 may include a first adjuster 451 and a second adjuster 452.

The first adjuster 451 may adjust current amounts of the first current path I1 and the second current path I2 of the current mirror 420 in accordance with the first power voltage V1.

The second adjuster 452 may block the leakage current of the second current path I2 of the current mirror 420 according to the input signal IN. The second adjuster 452 may include a delay circuit 453.

The third adjustment circuit 450 may include the delay circuit 453 and a plurality of switching elements NT3, NT4, and NT5.

For example, when the first power voltage V1 may be about 0.8V and the second power voltage V2 may be about 1.2V, the internal voltages of each of the transistors have to maintain under the maximum operating voltage ((1.1~1.2)× V1) to guarantee the reliability of all the low voltage transistors.

Therefore, the level shifter 400 according to the embodiment shown in FIG. 5 is designed to satisfy the above-described node voltage difference condition using the first adjustment circuit 430 and the second adjustment circuit 410, and additionally, the third adjustment circuit 450 of the level shifter 400 is configured to improve stability and a leakage current prevention function.

The first switching element NT1 may include one end connected to a ground terminal, another end connected to a node NODE_4, and a control end receiving the input signal IN.

At this time, one end of the plurality of switching elements NT1, NT2, PT1, PT2, and PT3 may be a source or a drain, another end may be a drain or a source, and a control end may be a gate.

The inverter INV1 may invert the input signal IN to generate an inverted input signal INB.

The second switching element NT2 may include one end connected to the ground terminal, another end connected to a node NODE_7, and a control end receiving the inverted input signal INB.

The third switching element PT1 may include one end connected to the terminal of the second power voltage V2 and another end connected to the terminal of the output voltage OUT.

The fourth switching element PT2 may include one end connected to the terminal of the second power voltage V2 and another end connected to a node NODE_5.

The fifth switching element PT4 may include one end connected to the terminal of the output voltage OUT, another end connected to a node NODE_3, and a control end receiving the first bias voltage VB_1.

As above, the first bias voltage VB_1 may be set in a level for securing the reliability of the fifth switching element PT4 including the low voltage transistor. For example, the first bias voltage VB_1 may be set such that a difference between the output voltage OUT and the first bias voltage VB_1 is below the maximum operating voltage. In embodiments, when the first power voltage V1 may be about 0.8V and the second power voltage V2 may be about 1.2V, the first bias voltage VB_1 may be about 0.12V.

Because the first bias voltage VB_1 may be inputted into the control terminal (i.e., gate) of the fifth switching element PT4, for example, the gate, the output voltage OUT corresponding to the source voltage may have a range of (VB_1+ $Vth_{PT4}$)~V2 in the AC operation. The output voltage OUT may be fixed to (VB_1+$Vth_{PT4}$) or V2 in the DC operation. Thus, the reliability of the switching elements PT1, PT2, PT3, PT4, PT5 and PT6 configured to receive the second power voltage V2 may be secured.

The voltage Vtp shown in FIG. 4 may be a threshold voltage Vth_PT4 of the switching element PT4. That is, the first PMOS gate signal PG<1> shown in FIG. 4 has the variation range corresponding to VB_1+Vth_PT4 to V2.

The sixth switching element PT6 may include one end connected to the terminal of the second power voltage V2, another end connected to the terminal of the output voltage OUT, and a control end receiving the compensation voltage V_TIE.

The seventh to ninth switching elements PT5, NT6, and NT7 may be connected between the terminal of the second power voltage V2 and the ground terminal, and may generate the compensation voltage V_TIE according to the second power voltage V2.

Current mirroring of the sixth switching element PT6 may be performed according to the compensation voltage V_TIE generated by the seventh to ninth switching elements PT5, NT6, and NT7, and a current according thereto may be supplied to the terminal of the output voltage OUT.

Since the sixth switching element PT6 continuously supplies the current to the terminal of the output voltage OUT, the output voltage OUT may be prevented from being lower than VB_1+Vth_PT4 even though the input signal IN of a high level is input to the control end of the first switching element NT1.

In example embodiments, the compensation voltage V_TIE may be set below such that a voltage difference between compensation voltage V_TIE and the second power voltage V2 may be below maximum operating voltage. Further, the compensation voltage V_TIE may be turned-off the sixth switching element PT6 corresponding the output voltage compensator 411. Although the sixth switching element PT6 may be turned-off by the compensation voltage V_TIE, an off-current of the sixth switching element PT6 may be continuously provided to the output voltage terminal.

The second power voltage V2 may be applied to the source of the seventh switching element PT5 in the compensation voltage generator 412. The gate and the drain of the seventh switching element PT5 may be commonly connected with each other. The compensation voltage V_TIE may be generated from the gate and the drain of the seventh switching element PT5. The drain of the eighth switching element NT6 may be connected to the drain of the seventh switching element PT5. The gate of the eighth switching element PT6 may receive the second power voltage V2. The drain of the ninth switching element NT7 may be connected to the drain of the eighth switching element NT6. The gate and the source of the ninth switching element NT7 may be connected in common.

When the level shifter 400 is driven for a long time, heat dissipation may be generated. When a driving force of the NMOS transistors NT1~NT4 constituting the current mirror 420 may be increased due to the heat dissipation, the output voltage of the level shifter 400 may be decreased. The compensation voltage generator 412 of example embodiments may include the eighth and ninth switching elements NT6 and NT7 reflecting on the driving force of the NMOS transistors NT1~NT4 of the current mirror 420. Thus, current amount discharged by the NMOS transistors NT1~NT4 of the current mirror 420 may be compensated by the eighth and the ninth switching elements NT6 and NT7.

Further, the current of the output voltage compensator 411 may mirror the current of the compensation voltage generator 412, the compensated off-current may also be provided to the output voltage compensator 411 to continuously maintain the output voltage OUT of no less than VB_1+ Vth_PT4.

The sixth switching element PT6 prevents the output voltage OUT from being lower than VB_1+Vth_PT4, and thus operation reliability of the third switching element PT1 may be guaranteed.

In embodiments, the output voltage OUT of the sixth switching element PT6 may be maintained above VB_1+ Vth_PT4 to secure the reliability of the third switching element PT1 directly receiving the second power voltage V2. Further, because the output voltage OUT may be within VB_1+Vth_PT4~V2, the reliability of the switching elements PT1, PT2 and PT3 controlled by the output voltage OUT may be secured.

The tenth switching element NT3 includes one end connected to the node NODE_3, another end connected to the node NODE_4, and a control end receiving the first power voltage V1.

Since the tenth switching element NT3 receives the first power voltage V1 through the control end, operation reliability of the first switching element NT1 may be secured by lowering a voltage of the node NODE_4 by V1−Vth_NT3, Vth_NT3 denoting a threshold voltage of the tenth switching element NT3.

The eleventh switching element NT4 includes one end connected to the node NODE_5, another end connected to a node NODE_6, and a control end receiving the first power voltage V1.

The eleventh switching element NT4 may also operate in the same manner as the tenth switching element NT3 to secure an operation reliability of the twelfth switching element NT5, which is described later.

The delay circuit 453 may be implemented as an inverter array 453 including a plurality of inverters 522.

The inverter array 453 may delay and invert the inverted input signal INB to generate a delayed input signal IN_Delay.

The twelfth switching element NT5 includes one end connected to the node NODE_6, another end connected to the node NODE_7, and a control end receiving the delayed input signal IN_Delay.

The twelfth switching element NT5 may operate at a time difference from the second switching element NT2 according to the delayed input signal IN_Delay to minimize the leakage current by preventing a current path from being formed for more than a time required for a level transition of the terminal of the output voltage OUT. For example, the twelfth switching element NT5 may be turned on a given time interval after the second switching element NT2 has been turned on, the given time interval corresponding to the delay amount of the delay circuit 453.

FIG. 5 shows the configuration of the level shifter 400 generating the output signal OUT corresponding to the first PMOS gate signal PG<1> in FIG. 4. However, embodiments of the present disclosure are not limited thereto. A level shifter according to an embodiment of the present disclosure may also generate the second to n-th PMOS gate signals PG<2:n> identically to the first PMOS gate signal PG<1>.

Figure 6:
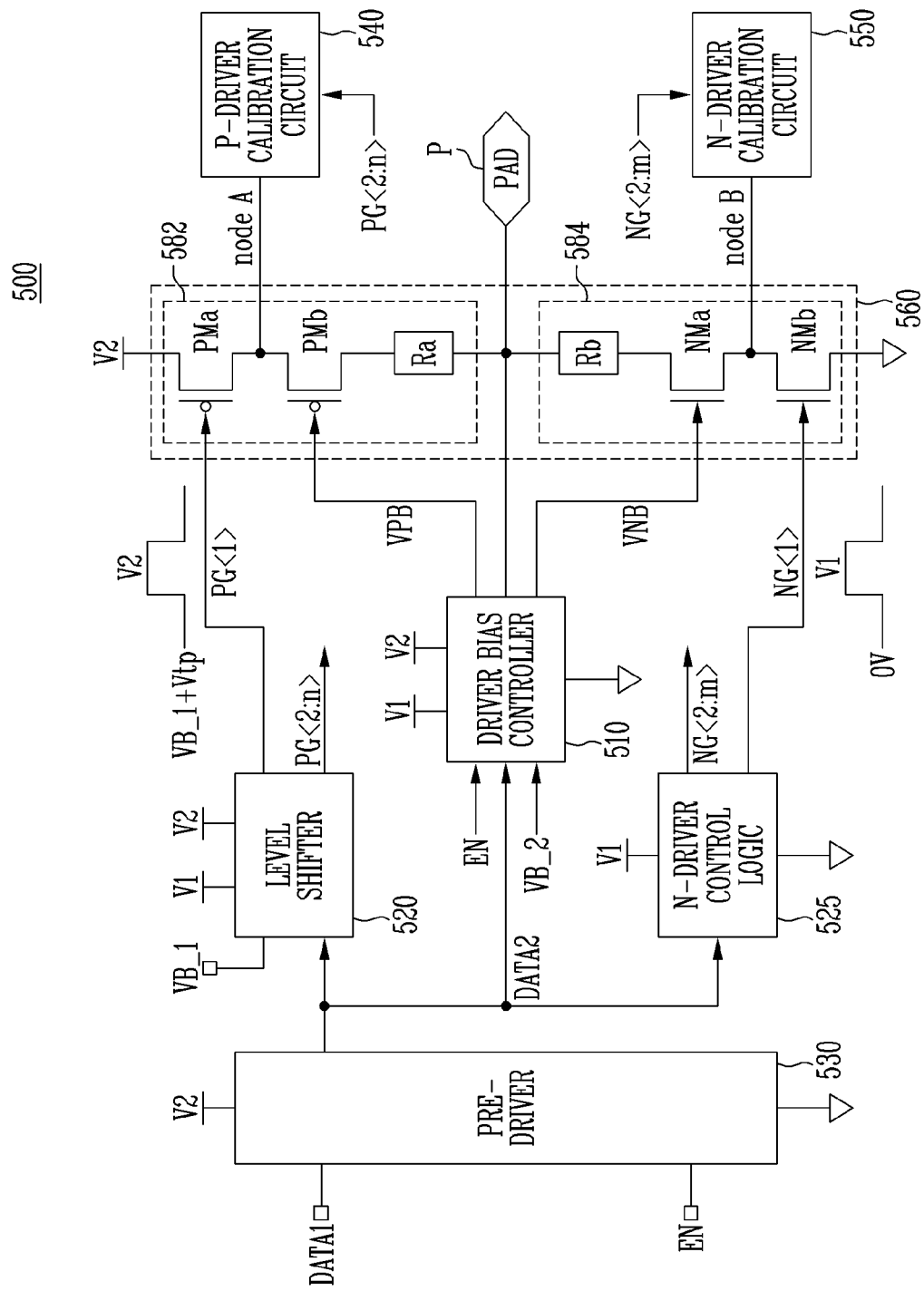
FIG. 6 is a block diagram illustrating an interface circuit block 500 according to still another embodiment of the present disclosure.

FIG. 6 is a block diagram illustrating an interface circuit block 500 according to still an embodiment of the present disclosure.

Referring to FIG. 6, the interface circuit block 500 includes a pre-driver 530, a level shifter 520, a driver control logic (e.g., an N-driver control logic) 525, a first driver calibration circuit (e.g., a P-driver calibration circuit) 540, a second driver calibration circuit (e.g., an N-driver calibration circuit) 550, an output driver 560, and a driver bias controller 510. The pull-up-down driver 560 includes a first PMOS transistor PMa, a second PMOS transistor PMb, a first NMOS transistor Nma, a second NMOS transistor NMb, a first resistor Ra, and a second resistor Rb. For example, the output driver 560 include a pull-up driver 582 and a pull-down driver 584, such that the pull-up driver 582 includes the first PMOS transistor PMa, the second PMOS transistor PMb, and the first resistor Ra, and the pull-down driver 584 includes the first NMOS transistor Nma, the second NMOS transistor NMb, and the second resistor Rb. In FIG. 6, the pre-driver 530, the level shifter 520, the N-driver control logic 525, the P-driver calibration circuit 540, and the N-driver calibration circuit 550 may be substantially the same as the pre-driver 330, the level shifter 320, the N-driver control logic 325, the P-driver calibration circuit 340, and the N-driver calibration circuit 350 shown in FIG. 4, respectively. Therefore, repetitive description of the pre-driver 530, the level shifter 520, the N-driver control logic 525, the P-driver calibration circuit 540, and the N-driver calibration circuit 550 is omitted.

The driver bias controller 510 may operate based on the first and second power voltages V1 and V2. In addition, the driver bias controller 510 may be connected to the pad and receive the enable signal EN, the second data signal DATA2, and the second bias voltage VB_2. The driver bias controller 510 generates a first bias voltage (e.g., a P-bias voltage) VPB and a second bias voltage (e.g., an N-bias voltage) VNB that change according to a pad state, based on one or more of the received signals. The P-bias voltage VPB is applied to the second PMOS transistor PMb of the output driver 560. The N-bias voltage VNB is applied to the first NMOS transistor NMa of the output driver 560. The driver bias controller 510 controls the P-bias voltage VPB to have a value between the second bias voltage VB_2 and the first power voltage V1, according to the state of the pad. As the P-bias voltage VPB has the value between the second bias voltage VB_2 and the first power voltage V1, when a voltage of the pad has a voltage value between 0V and the second power voltage V2, the reliability condition of the low voltage transistor is satisfied during an operation of the second PMOS transistor PMb.

In addition, the driver bias controller 510 controls the N-bias voltage VNB to have a value between the first power voltage V1 and the second power voltage V2, according to the state of the pad. As the N-bias voltage VNB has the value between the first power voltage V1 and the second power voltage V2, when the voltage of the pad has a voltage value between 0V and the second power voltage V2, the reliability condition of the low voltage transistor with a thin gate oxide is satisfied during an operation of the first NMOS transistor NMa.

A preferred interface circuit block is disclosed in U.S. patent application Ser. No. 17/076,474, filed Oct. 21, 2020 and entitled, "OUTPUT DRIVING CIRCUIT,", the entire disclosure of which is incorporated herein by reference.

An embodiment of the driver bias controller 510 shown in FIG. 6 is described with reference to FIG. 7.

Figure 7:
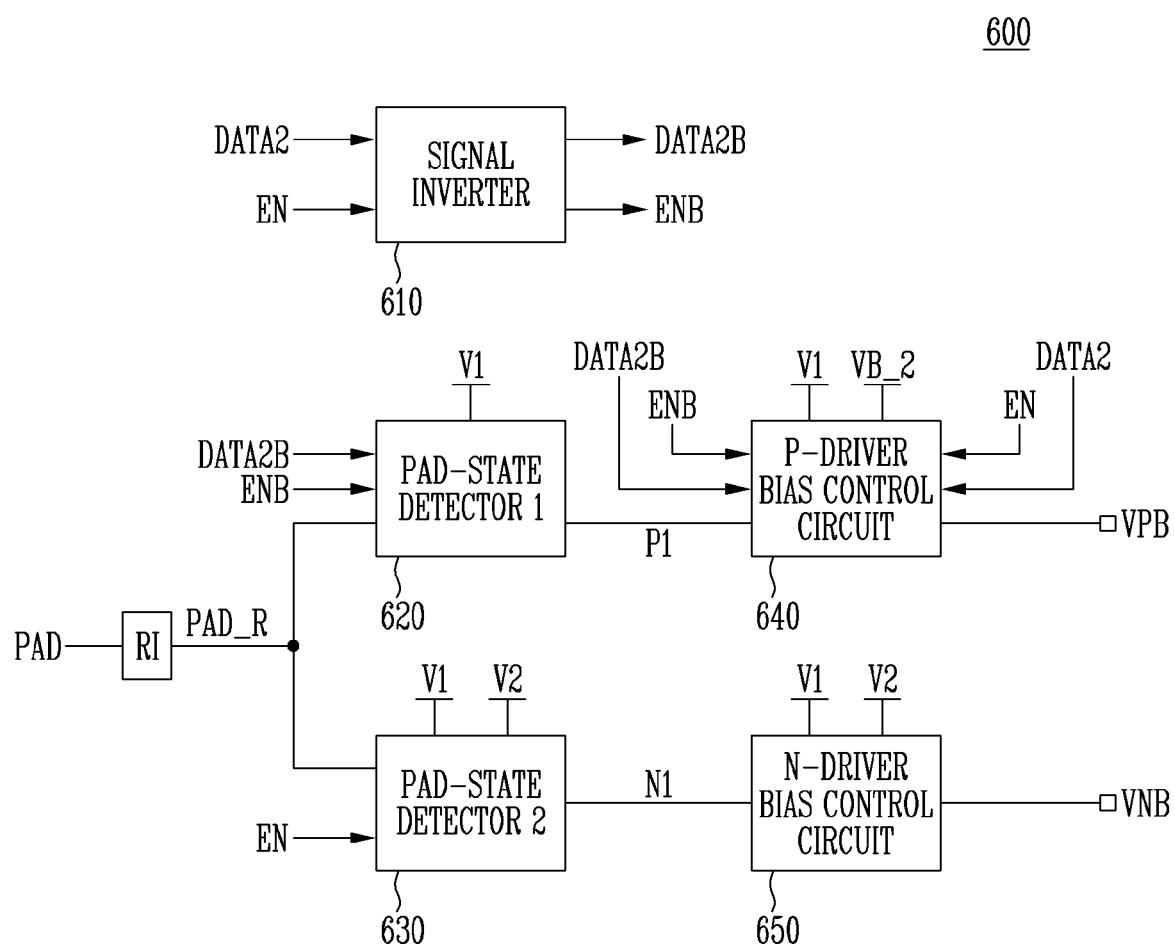
FIG. 7 is a block diagram illustrating a driver bias controller 600 according to an embodiment of the present disclosure.

FIG. 7 is a block diagram illustrating a driver bias controller 600 according to an embodiment of the present disclosure.

Referring to FIG. 7, the driver bias controller 600 includes a signal inverter 610, a first pad-state detector 620, a second pad-state detector 630, a P-driver bias control circuit 640, an N-driver bias control circuit 650, and an internal resistor RI. The internal resistor RI is connected to the pad. The P-driver bias control circuit 640 and the N-driver bias control circuit 650 are connected to the internal resistor RI. The internal resistor RI may be used for the ESD protection resistor, the impedance control resistor or the voltage stabilization resistor.

The signal inverter 610 may receive the second data signal DATA2 and the enable signal EN to generate a second inverted data signal DATA2B and an inverted enable signal ENB. An example configuration of the signal inverter 610 is described later with reference to FIG. 8.

The first pad-state detector 620 detects a voltage state of the pad having a voltage between 0V and the second power voltage V2 through the internal resistor RI. More specifically, the voltage of the pad may be changed from a low voltage to a high voltage or from a high voltage to a low voltage, in a range of 0V to the second power voltage V2. The first pad-state detector 620 detects the voltage state of the pad, which is changed as described above, and outputs a detection result to a node P1. To this end, the first pad-state detector 620 operates based on the first power voltage V1 and receives the second inverted data signal DATA2B and the inverted enable signal ENB. A specific configuration of the first pad-state detector 620 is described with reference to FIG. 9.

The P-driver bias control circuit 640 is connected to the first pad-state detector 620 through the node P1. The P-driver bias control circuit 640 may operate based on the first power voltage V1 and the second bias voltage VB_2. In addition, the P-driver bias control circuit 640 receives the second data signal DATA2, the enable signal EN, the second inverted data signal DATA2B, and the inverted enable signal ENB. The P-driver bias control circuit 640 generates a P-bias voltage VPB according to the second inverted data signal DATA2B input based on the pad state detected by the first pad-state detector 620. A specific configuration of the P-driver bias control circuit 640 is described with reference to FIG. 10.

The second pad-state detector 630 detects the voltage state of the pad having the voltage between 0V and the second power voltage V2 through the internal resistor RI. More specifically, the voltage of the pad may be changed from a low voltage to a high voltage or from a high voltage to a low voltage in a range of 0V to the second power voltage V2. The second pad-state detector 630 detects the voltage state of the pad, which is changed as described above, and outputs the detection result to a node Ni. To this end, the second pad-state detector 630 operates based on the first and second power voltages V1 and V2, and receives the enable signal EN. In addition, although not shown in FIG. 7, the second pad-state detector 630 may receive the first PMOS gate signal PG<1> generated by the level shifter 520. A specific configuration of the second pad-state detector 630 is described with reference to FIG. 11.

The N-driver bias control circuit 650 is connected to the second pad-state detector 630 through the node N1. The N-driver bias control circuit 650 generates an N-bias voltage VNB according to the pad state detected by the second pad-state detector 630. The N-driver bias control circuit 650 may operate based on the first and second power voltages V1 and V2. A specific configuration of the N-driver bias control circuit 650 is described with reference to FIG. 12.

Figure 8:
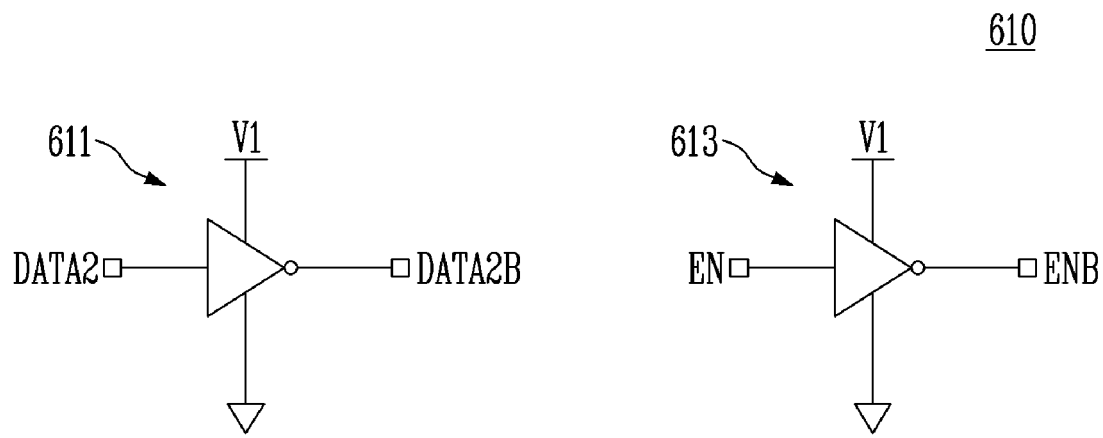
FIG. 8 is a diagram illustrating signal inverter 610 of FIG. 7 according to an embodiment of the present disclosure.

FIG. 8 is a diagram illustrating a signal inverter 610a suitable for use as the signal inverter 610 of FIG. 7, according to an embodiment. Referring to FIG. 8, the signal inverter 610a may include a plurality of inverters 611 and 613. The inverter 611 operates based on the first power voltage V1, and inverts the second data signal DATA2 to output the second inverted data signal DATA2B. The inverter 613 operates based on the first power voltage V1, and inverts the enable signal EN to output the inverted enable signal ENB. Since the plurality of inverters 611 and 613 operate based on the first power voltage V1, each of the second inverted data signal DATA2B and the inverted enable signal ENB may be signals having a voltage value between 0V and the first power voltage V1.

Figure 9:
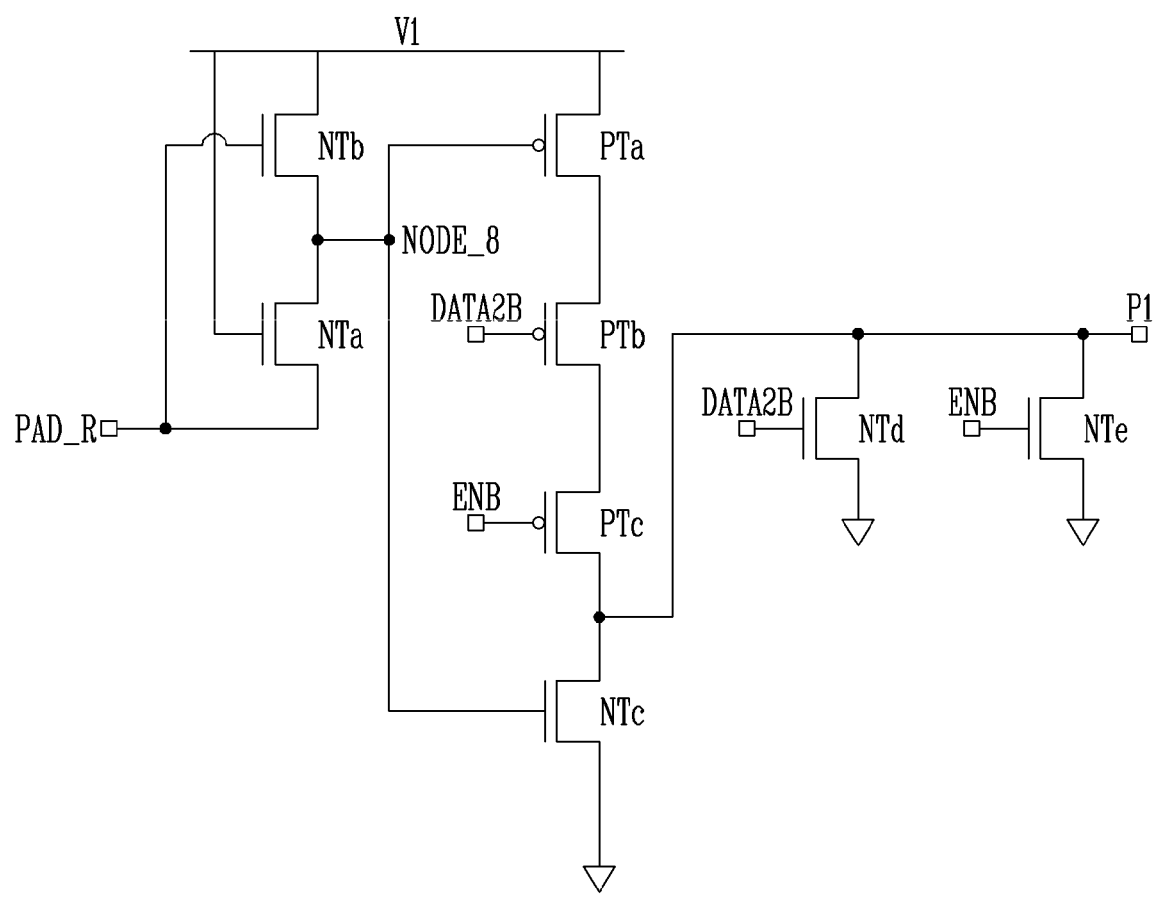
FIG. 9 is a diagram illustrating a first pad-state detector 620 of FIG. 7 according to an embodiment of the present disclosure.

FIG. 9 is a diagram illustrating a first pad-state detector 620a suitable for use as the first pad-state detector 620 of FIG. 7, according to an embodiment.

Referring to FIG. 9, the first pad-state detector 620 includes NMOS transistors NTa, NTb, NTc, NTd, and NTe and PMOS transistors PTa, PTb, and PTc. The NMOS transistors NTa and NTb are connected in series between the first power voltage V1 and a node PAD_R. The first pad-state detector 620 is connected to the resistor RI of FIG. 7 through the node PAD_R. In an embodiment, a voltage of the node PAD_R may be the same as the voltage of the pad. A gate of the NMOS transistor NTa is connected to the first power voltage V1, and a gate of the NMOS transistor NTb is connected to the node PAD_R. The NMOS transistor NTb is included to block a leakage current. When there is no NMOS transistor NTb, a voltage of a node Node_8 has a level value of the first power voltage V1—a threshold voltage $VT_{NTa1}$ of the NMOS transistor NTa. In this case, since a voltage of $V1-VT_{NTa}$ is supplied to a gate of the PMOS transistor PTa or a gate of the NMOS transistor NTc, not the first power voltage V1, a leakage current path may be generated. When the NMOS transistor NTb is connected between the first power voltage V1 and the node NODE_8, the first power voltage V1 is completely supplied to the node NODE_8 to prevent an occurrence of the leakage current. In other words, since the NMOS transistor NTb is connected between the first power voltage V1 and the node NODE_8 as shown in FIG. 9, the voltage of the node NODE_8 may have a level substantially equal to the first power voltage V1, rather than $V1-VT_{NM1}$, thereby preventing an occurrence of the leakage current.

The PMOS transistors PTa, PTb, and PTc are connected in series between the first power voltage V1 and the node P1. The gate of the PMOS transistor PTa is connected to the node NODE_8. The second inverted data signal DATA2B is applied to the gate of the PMOS transistor PTb. The inverted enable signal ENB is applied to a gate of the PMOS transistor PTc.

When the enable signal EN is deactivated to a logic low, the inverted enable signal ENB is activated to a logic high. Therefore, in this case, the PMOS transistor PTc is turned off, and thus a voltage transfer path between the first power voltage V1 and the node P1 is blocked regardless of the second data signal DATA2.

The NMOS transistor NTc is connected between the node P1 and the ground. The gate of the NMOS transistor NTc is connected to the node NODE_8.

The NMOS transistors NTd and NTe are connected in parallel between the node P1 and the ground. The second inverted data signal DATA2B is applied to a gate of the NMOS transistor NTd. The inverted enable signal ENB is applied to a gate of the NMOS transistor NTe.

When the enable signal EN is deactivated to a logic low, the inverted enable signal ENB is activated to a logic high. Therefore, in this case, the NMOS transistor NTe is turned on, and thus the voltage of the node P1 maintains a low level regardless of the second data signal DATA2.

According to a circuit structure of FIG. 9, the voltage of the node P1 is determined according to the pad voltage and the second data signal DATA2. When the voltage of the pad P is a low voltage, for example, the ground voltage and a signal of the second inverted data signal DATA2B is a voltage of a logic high state, the PMOS transistor PTb is turned off and the NMOS transistor NTd is turned on, and thus the voltage of the node P1 becomes a logic low state.

The voltage state of the pad is the same as that of the second data signal DATA2, but some delay may occur between the two states. That is, when the second data signal DATA2 is changed from a logic low state to a logic high state, that is, when the second inverted data signal DATA2B is changed from a logic high state to a logic low state, the pad voltage maintains a logic low state during a certain time period from a time point of the change. In this period, this causes the voltage of the node P1 to be in a logic low state by the NMOS transistor NTd. The PMOS transistor PTb receiving the second inverted data signal DATA2B having a logic low state through the gate is turned on and the NMOS transistor NTd is turned off. Therefore, the voltage of the node P1 temporarily increases to the first power voltage V1. That is, the second inverted data signal DATA2B has a logic low state, the inverted enable signal ENB has a logic low state, and the pad voltage has a logic low state during a given time period, the PMOS transistors PTa, PTb, PTc are turned on and the NMOS transistors NTc, NTd, and NTe are turned off. As a result, the first power voltage V1 and the node P1 are coupled to increase the voltage of the node P1 substantially equal to the first power voltage V1. Subsequently, the pad voltage changes to a logic high state to turn on the NMOS transistor NTb, and thus the voltage of the node NODE_8 increases to turn on the NMOS transistor NTc, thereby coupling the node P1 to the ground. Accordingly, the voltage of the node P1 increases to the first power voltage V1 during the time period, and then decreases.

Figure 10:
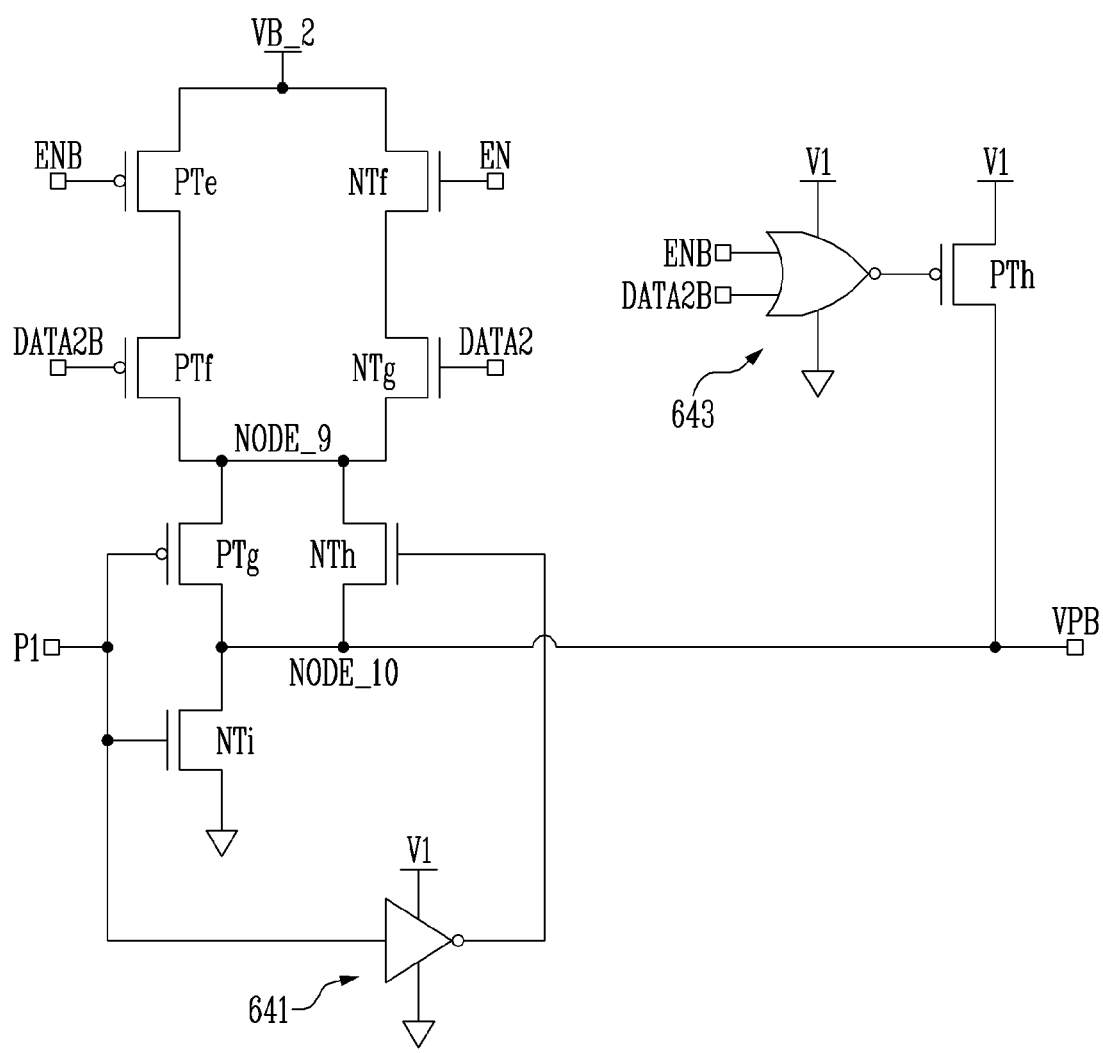
FIG. 10 is a diagram illustrating a P-driver bias control circuit 640 of FIG. 7 according to an embodiment of the present disclosure.

FIG. 10 is a diagram illustrating a P-driver bias control circuit 640a suitable for use as the P-driver bias control circuit 640 of FIG. 7, according to an embodiment. Referring to FIG. 10, the P-driver bias control circuit 640a may include NMOS transistors NTf, NTg, NTh, and NTi, PMOS transistors PTe, PTf, PTg, and PTh, an inverter 641, and a negative-OR gate (NOR gate) 643. The NMOS transistors NTf and NTg are connected in series between the second bias voltage VB_2 and a node NODE_9. The enable signal EN is applied to a gate of the NMOS transistor NTf, and the second data signal DATA2 is applied to a gate of the NMOS transistor NTg. The PMOS transistors PTe and PTf are connected in series between the second bias voltage VB_2 and the node NODE_9. The inverted enable signal ENB and the second inverted data signal DATA2B are applied to gate terminals of the PMOS transistors PTe and PTf, respectively.

The PMOS transistor PTg and the NMOS transistor NTh are connected in parallel between the node NODE_9 and a node NODE_10. The node NODE_10 may be directly connected to an output terminal of the P-driver bias control circuit 640. The P-bias voltage VPB is output through the output terminal of the P-driver bias control circuit 640. Meanwhile, the NMOS transistor NTi is connected between the node NODE_10 and the ground.

A gate terminal of the PMOS transistor PTg and a gate terminal of the NMOS transistor NTi are connected to the node P1. The node P1 may be an output node of the first pad-state detector 620. Meanwhile, an input terminal of the inverter 641 may be connected to the node P1, and an output terminal of the inverter 641 may be connected to the gate of the NMOS transistor NTh.

The NOR gate 643 performs an NOR operation on the inverted enable signal ENB and the second inverted data signal DATA2B, and output the operation result to the gate of the PMOS transistor PTh. The PMOS transistor PTh is connected between the first power voltage V1 and an output terminal VPB of the P-driver bias control circuit 640a. In a case of the NOR gate 643, an output of a logic-low is applied to the gate of the PMOS transistor PTh regardless of a level of the second inverted data signal DATA2B while the inverted enable signal ENB has a logic-high state. In this case, the PMOS transistor PTh is turned on to output the first power voltage V1 to the output terminal. At this time, the second PMOS transistor PMb shown in FIG. 6 is turned off.

When a voltage level of the node P1 is a low level, a voltage VPB of the output terminal becomes the first power voltage V1. In this state, when a voltage level of the second data signal DATA2 increases from a low level to a high level, the voltage of the node P1 temporarily increases to a level of the first power voltage V1. As the voltage level of the node P1 increases, the NMOS transistor NTi is turned on, and thus the P-bias voltage VPB output to the output terminal temporarily decreases to a low level, that is, the ground voltage level.

When the voltage VPB of the output terminal is the first power voltage V1, this voltage is applied to the gate of the second PMOS transistor PMb of FIG. 6. At this time, a source voltage of the second PMOS transistor PMb, that is, a voltage of the node NODE_A has a level of the first power voltage V1+a threshold voltage $VT_{PMb}$ of the second PMOS transistor PMb. Since a drain voltage of the second PMOS transistor PMb, that is, the voltage of the pad P is a low level, in a state in which the voltage of the pad P is not increased to the first power voltage V1 or more, even though the P-bias voltage VPB momentarily decreases to a low level, for example, 0V, the gate-source voltage VGS, the gate-drain voltage VGD, and the drain-source voltage VDS of the second PMOS transistor PMb are within the reliability range condition.

In a situation in which the voltage of the pad P increases to the first power voltage V1 or more, the voltage of the node P1 decreases again to a low level. At this time, the P-bias voltage VPB temporarily increases to the first power voltage V1 to satisfy the reliability condition of the second PMOS transistor PMb. Thereafter, the P-bias voltage VPB is changed to the second bias voltage VB_2 in a state in which the voltage of the pad P is stabilized to the second power voltage V2.

Accordingly, the first pad-state detector 620 and the P-driver bias control circuit 640 output the P-bias voltage VPB having a voltage value between the second bias voltage VB_2 and the first power voltage V1. Accordingly, the second PMOS transistor PMb may operate in a state that satisfies the reliability condition.

As a result, the second PMOS transistor PMb may be driven based on the voltage level of the pad P. Thus, the second PMOS transistor PMb may be driven in consideration on a duty ratio between a voltage-variation of the node A and a delay time at which the second data signal DATA 2 is transmitted to the pad P.

Figure 11:
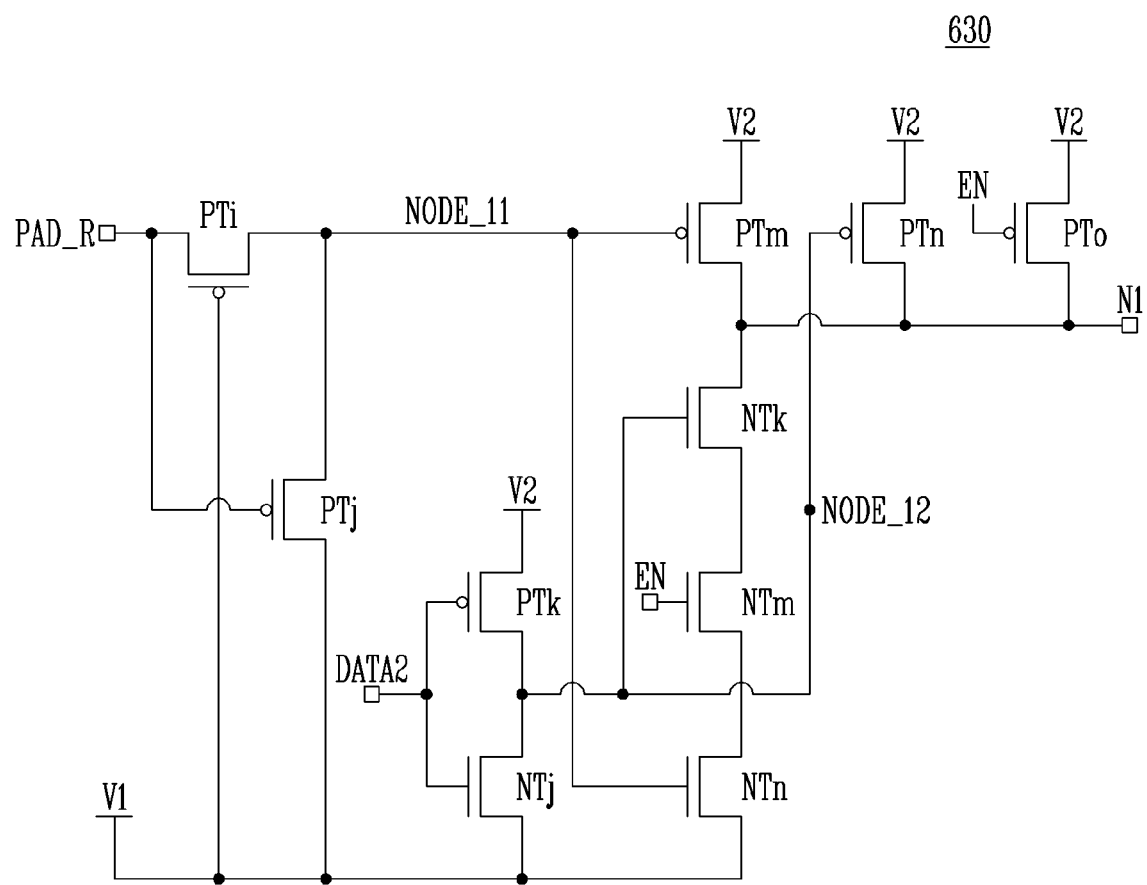
FIG. 11 is a diagram illustrating a second pad-state detector 630 of FIG. 7 according to an embodiment of the present disclosure.

FIG. 11 is a diagram illustrating a second pad-state detector 630a suitable for use as the second pad-state detector 630 of FIG. 7, according to an embodiment.

Referring to FIG. 11, the second pad-state detector 630a may include NMOS transistors NTj, NTk, NTm, and NTn, and PMOS transistors PTi, PTj, PTk, PTm, PTn, and PTo.

The PMOS transistor PTi is connected between the node PAD_R and a node NODE_11. A gate of the PMOS transistor PTi is connected to the first power voltage V1. The PMOS transistor PTj is connected between the node NODE_11 and the first power voltage V1. A gate of the PMOS transistor PTj is connected to the node PAD_R. The PMOS transistor PTk and the NMOS transistor NTj are connected in series between the second power voltage V2 and the first power voltage V1. Gates of the PMOS transistor PTk and the NMOS transistor NTj are connected to the first PMOS gate signal PG<1>. The PMOS transistor PTm is connected between the second power voltage V2 and the node Ni. A gate of the PMOS transistor PTm is connected to the node NODE_11. The NMOS transistors NTk, NTm, and NTn are connected in series between the node Ni and the first power voltage V1. A gate of the NMOS transistor NTk is connected to a node NODE_12. The enable signal EN is applied to a gate of the NMOS transistor NTm. The node NODE_11 is connected to a gate of the NMOS transistor NTn.

The PMOS transistors PTn and PTo are connected in parallel between the second power voltage V2 and the node Ni. A gate of the PMOS transistor PTn is connected to a node NODE_12. A gate of the PMOS transistor PTo is connected to the enable signal EN.

When the second data signal DATA2 has a low level voltage value, and thus, the voltage of the pad P is 0V, the PMOS transistor PTk may be turned on by the second data signal DATA2 of a low state. Accordingly, a voltage of the node NODE_12 becomes a level of the second power voltage V2. When the voltage of the pad P increases to a high level, for example, the level of the second power voltage V2, the NMOS transistor NTj may be turned on by the second data signal DATA2 of a high state. Accordingly, the voltage of the node NODE_12 becomes a level of the first power voltage V1.

When the voltage of the pad P is changed from a high level to a low level, due to a delay time between the voltage of the pad P and the second data signal DATA2, a voltage level of the node NODE_12 temporarily decreases from the second power voltage V2 to the first power voltage V1.

In addition, when the enable signal EN is activated to a high level, an inverter configured of the PMOS transistor PTm and the NMOS transistor NTk, NTm, and NTn is activated. In this case, the voltage of the node NODE_12 is changed according to the voltage of the pad P and the node PAD_R. When the enable signal EN is deactivated to a low level, the inverter configured of the PMOS transistor PTm and the NMOS transistors NTk, NTm, and NTn is deactivated, and the voltage of the node Ni is fixed to the second power voltage V2 by the PMOS transistor PTo.

Figure 12:
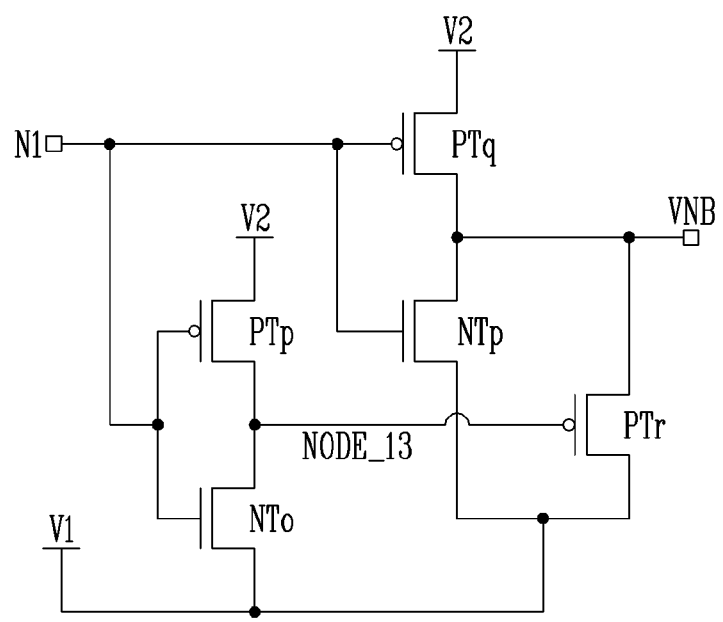
FIG. 12 is a diagram illustrating an N-driver bias control circuit 650 of FIG. 7 according to an embodiment of the present disclosure.

FIG. 12 is a diagram illustrating an N-driver bias control circuit 650a suitable for used as the N-driver bias control circuit 650 of FIG. 7, according to an embodiment. Referring to FIG. 12, the N-driver bias control circuit 650a includes NMOS transistors NTo and NTp and PMOS transistors PTp, PTq, and PTr.

The PMOS transistor PTp and the NMOS transistor NTo are connected between the second power voltage V2 and the first power voltage V1. Gates of the PMOS transistor PTp and the NMOS transistor NTo are connected to the node N1. The PMOS transistor PTp and the NMOS transistor NTo are connected to each other through a node NODE_13.

Meanwhile, the PMOS transistor PTq and the NMOS transistor NTp are connected between the second power voltage V2 and the first power voltage V1. Gates of the PMOS transistor PTq and the NMOS transistor NTp are connected to the node N1. The PMOS transistor PTq and the NMOS transistor NTp are connected to each other by a node outputting the N-bias voltage VNB.

The PMOS transistor PTr is connected between the node outputting the N-bias voltage VNB and the first power voltage V1. A gate of the PMOS transistor PTr is connected to the node NODE_13.

When a voltage level of the node Ni as the input terminal is the second power voltage V2, the N-bias voltage VNB becomes the level of the first power voltage V1 by the NMOS transistor NTp. When the voltage of the node Ni temporarily decreases from the second power voltage V2 to the first power voltage V1 due to a delay between the voltage of the pad P and the second data signal DATA2, the N-bias voltage VNB is temporarily increased to the second power voltage V2.

Accordingly, the second pad-state detector 630 and the N-driver bias control circuit 650 output the N-bias voltage VNB having a voltage value between the first power voltage V1 and the second power voltage V2. Thus, the first NMOS transistor NMa may operate in a state that satisfies the reliability condition.

As a result, the first NMOS transistor NMa may be driven based on the voltage level of the pad P. Thus, the first NMOS transistor NMa may be driven in consideration on a duty ratio between a voltage-variation of the node B and the delay time at which the second data signal DATA 2 is transmitted to the pad P.

According to example embodiments, the interface circuit block configured to receive the high voltage as the power voltage may include the low voltage transistors. The optimal control bias may be supplied to the low voltage transistor configured to directly receive the high voltage to guarantee the reliability and to drive the interface circuit by the low voltage.

What is claimed is:

1. An interface circuit connected between a pad and an internal circuit, the interface circuit comprising:
   a pull-up driver including a first PMOS transistor, a second PMOS transistor and a first impedance controller, the first PMOS transistor connected between a power terminal provided to a power voltage and a first connection node and controlled by a first control bias, the second PMOS transistor connected between the first connection node and the pad and normally turned-on, and the first impedance controller connected to the first connection node to control an impedance of the first connection node based on the first control bias; and
   a pull-down driver including a first NMOS transistor and a second NMOS transistor, the first NMOS transistor connected between the pad and a second connection node and controlled by a driving voltage, and the second NMOS transistor connected between the second connection node and a ground voltage terminal,
   wherein the first PMOS transistor and the second PMOS transistor are driven by the driving voltage and a difference between the first control bias and the power voltage is substantially equal to or less than a maximum operating voltage of the first and second PMOS transistors.

2. The interface circuit of claim 1, wherein the maximum operating voltage is about 1.1 times to about 1.2 times the driving voltage and the maximum operating voltage is less than the power voltage.

3. The interface circuit of claim 1, wherein the first control bias is a sum of a first bias voltage and a threshold voltage of the first PMOS transistor.

4. The interface circuit of claim 2, wherein a gate of the second PMOS transistor receives a second bias voltage, and the second bias voltage is set so that a voltage difference between the gate of the second PMOS transistor and a voltage of the first connection node is below the maximum operating voltage.

5. The interface circuit of claim 1, wherein the first impedance controller is connected between the power terminal and the first connection node and the first impedance controller comprises a plurality of PMOS transistors driven in response to a plurality of first control signals having a level substantially the same as a level of the first control bias.

6. The interface circuit of claim 1, further comprising a level shifter receiving the power voltage, the driving voltage and a first bias voltage, to generate the first control bias and a plurality of first control signals for controlling the first impedance controller,
   wherein the level shifter comprises at least one low voltage transistors driven at the driving voltage.

7. The interface circuit of claim 6, wherein the level shifter comprises:
   a current mirror configured to mirror a current corresponding to the power voltage;
   a first adjustment circuit connected to an output terminal of the current mirror, the first adjustment circuit receiving the first bias voltage which adjust a voltage level of the output terminal of the current mirror; and a second adjustment circuit connected between the power terminal and the output terminal of the current mirror to provide a compensation current corresponding to a current amount of the current mirror to the output terminal of the current mirror.

8. The interface circuit of claim 1, further comprising a first resistor electrically coupled between the pad and the second PMOS transistor to protect an electrostatic discharge (ESD) and control an impedance of the pull-up driver.

9. The interface circuit of claim 1, further comprising a second resistor electrically coupled between the pad and the first NMOS transistor to protect an electrostatic discharge (ESD) and control an impedance of the pull-down driver.

10. The interface circuit of claim 1, wherein the first NMOS transistor and the second NMOS transistor are driven at the driving voltage.

11. The interface circuit of claim 1, wherein a gate of the first NMOS transistor receives the driving voltage and a gate of the second NMOS transistor receives a voltage between about 0V and the driving voltage.

12. The interface circuit of claim 11, further comprising a second impedance controller connected to the second connection node to control an impedance of the second connection node in response to a plurality of second control signals, wherein the plurality of second control signals includes a voltage range between about 0V and the driving voltage.

13. The interface circuit of claim 12, wherein the second impedance controller comprises a plurality of NMOS transistors connected between the second connection node and the ground voltage terminal and driven in response to the plurality of second control signals.

14. The interface circuit of claim 11, further comprising an N-driver control logic configured to generate a plurality of second control signals for controlling the gate of the second NMOS transistor and an impedance of the second connection node.

* * * * *